US012694180B2

(12) United States Patent
Peng et al.

(10) Patent No.: US 12,694,180 B2
(45) Date of Patent: Jul. 28, 2026

(54) SYSTEMS AND METHODS FOR PROGRAMMABLE FABRIC DESIGN COMPILATION

(71) Applicant: Altera Corporation, San Jose, CA (US)

(72) Inventors: Yi Peng, Newark, CA (US); Scott Jeremy Weber, Piedmont, CA (US); Mahesh A. Iyer, Fremont, CA (US)

(73) Assignee: Altera Corporation, San Jose, CA (US)

( * ) Notice: Subject to any disclaimer, the term of this patent is extended or adjusted under 35 U.S.C. 154(b) by 91 days.

(21) Appl. No.: 17/856,799

(22) Filed: Jul. 1, 2022

(65) Prior Publication Data

US 2022/0335189 A1      Oct. 20, 2022

(51) Int. Cl.
| | |
|---|---|
| *G06F 30/343* | (2020.01) |
| *G06F 30/20* | (2020.01) |
| *G06F 30/327* | (2020.01) |
| *G06F 30/331* | (2020.01) |
| *G06F 30/347* | (2020.01) |

(52) U.S. Cl.
CPC ............ *G06F 30/343* (2020.01); *G06F 30/20* (2020.01); *G06F 30/327* (2020.01); *G06F 30/331* (2020.01); *G06F 30/347* (2020.01)

(58) Field of Classification Search
CPC ...... G06F 30/343; G06F 30/347; G06F 30/20; G06F 30/327; G06F 30/331
USPC ..... 716/104, 105, 117, 121, 128; 703/15, 20
See application file for complete search history.

(56) References Cited

U.S. PATENT DOCUMENTS

| | | | | | |
|---|---|---|---|---|---|
| 7,464,362 | B1 * | 12/2008 | Borer | .................... | G06F 30/347 |
| | | | | | 716/138 |
| 8,250,505 | B1 * | 8/2012 | Borer | ..................... | G06F 30/34 |
| | | | | | 716/132 |
| 9,503,094 | B1 * | 11/2016 | Munday | .......... | H03K 19/17728 |
| 10,339,243 | B2 * | 7/2019 | Brissenden | ............. | G06F 30/34 |
| 10,586,005 | B1 * | 3/2020 | Chandrasekar | ....... | G06F 30/327 |
| 10,726,181 | B1 * | 7/2020 | Voogel | .................. | G06F 30/331 |
| 2010/0199234 | A1 * | 8/2010 | Adya | .................... | G06F 30/392 |
| | | | | | 716/113 |
| 2017/0103156 | A1 * | 4/2017 | Gupta | .................... | G06F 30/398 |
| 2017/0262567 | A1 * | 9/2017 | Vassiliev | ................ | H04L 47/10 |

(Continued)

FOREIGN PATENT DOCUMENTS

CN      101131713 B   *   1/2012

OTHER PUBLICATIONS

Ding, Chinese Patent Document No. CN-112486248-A, published Mar. 12, 2021, 3 pages including abstract, claims and 1 drawing. (Year: 2021).*

*Primary Examiner* — Phallaka Kik
(74) *Attorney, Agent, or Firm* — Fletcher Yoder, P.C.

(57) ABSTRACT

Systems or methods of the present disclosure may provide a compilation design method that uses cloud computing resources and/or distributed computing resources to compile initial user designs. The initial user design for the programmable logic device may be partitioned into multiple designs for compilation based on periphery logic and core fabric logic. The compilation design method implements partition-level time budgeting and constraint generation using full device timing analysis. The final placed and routed netlist and bitstream SOF is generated by merging the placed and routed netlist and bitstream SOF of individual partition designs.

19 Claims, 7 Drawing Sheets

(56)  References Cited

U.S. PATENT DOCUMENTS

| | | | | | |
|---|---|---|---|---|---|
| 2018/0189427 | A1* | 7/2018 | Brissenden | ........... | G06F 30/347 |
| 2019/0005177 | A1* | 1/2019 | Sharma | ................. | G06F 30/331 |
| 2021/0256190 | A1* | 8/2021 | Kalte | ................... | G06F 30/343 |
| 2022/0066824 | A1* | 3/2022 | Kumar | ................. | G06F 9/5044 |
| 2022/0187367 | A1* | 6/2022 | Yi | ......................... | G06F 30/331 |

* cited by examiner

SYSTEMS AND METHODS FOR PROGRAMMABLE FABRIC DESIGN COMPILATION

BACKGROUND

The present disclosure relates generally to systems and methods for rapid programmable logic circuitry user design compilation. More particularly, the present disclosure relates to dividing a full programmable fabric design into one or more design segments, which may enable cloud computing and/or distributed computing resources to be used to reduce design compilation time.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

A programmable logic device, such as a field programmable gate array (FPGA), may be configured to implement a wide variety of system designs, sometimes referred to as user designs. User designs may be used in a wide variety of use cases, from signal processing to artificial intelligence to big data analysis. Some user designs may emulate a design for an application specific integrated circuit (ASIC). In this way, an ASIC designer may test various iterations of an ASIC system design before manufacturing the ASIC. Using a programmable logic device to emulate the ASIC system design may allow for rapid testing, since programmable logic devices may be able to emulate an ASIC system design significantly faster than a computer can simulate an ASIC system design.

Before implementing a user design on a programmable logic device, the user design may be compiled through a number of compilation flows that compiles the user design. Some user designs may involve multiple non-programmable, computation-intensive problems that may be time-intensive to compile using many compilation techniques. For example, some techniques for design compilation include implementing a variety of heuristics to improve convergence speed of the compilation process. Some techniques may also include optimizing various metrics of the compilation (e.g., timing, wire usage, routing congestion). In certain compilation flows, circuit optimization methods may not be included during compilation to reduce compilation time. This may result in a decrease in the quality of the results (e.g., output file) output from the programmable logic device operations. Additionally, some techniques may result in compilation time that is not low enough to meet a specification given the fundamental complexity of the non-programmable design problems.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
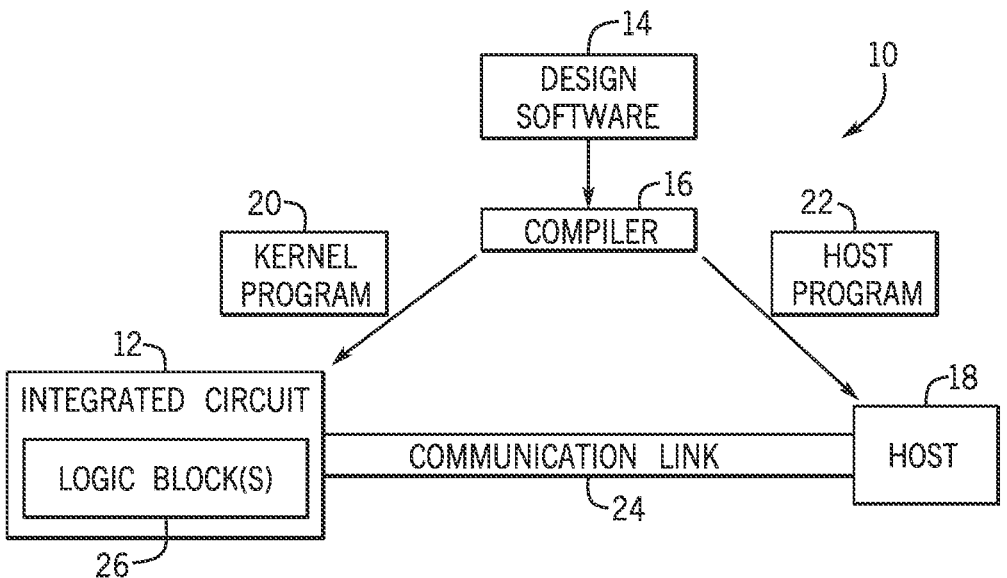
FIG. 1 is a block diagram of a system used to program an integrated circuit device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present systems and techniques relate to systems and methods of design compilation processing that may be implemented to reduce compilation speed of user designs for a programmable logic device. The full design (e.g., initial user design) received at the programmable logic device may be divided into one or more smaller designs, and the smaller designs may be compiled in parallel. The division of the full design may result in decreased compilation time compared to traditional compilation methods. For example, the division of the full design into one or more smaller designs for compilation may result in an improved compilation speed 10-times the speed compared to traditional compilation methods (e.g., 10-hour compilation time reduced to one hour). The division of the full design into two or more smaller designs for design compilation may result in shorter compilation times, reduced application development time, decreased resource demand per compute node, and reduced cost to operate. The compilation flow method may divide large user designs that are implemented using an emulator across one or more programmable logic devices, into multiple smaller design partitions that may be compiled on different compute nodes of the programmable logic devices. During compilation of the smaller design partitions, timing closure methods may be implemented to ensure efficient timing during the compilation.

In one embodiment, the programmable device may implement traditional timing closure at a full device level or may implement delay budgeting at one or more partition boundaries of the programmable devices. Additionally, the full programmable device database may be used to compile all the divided user design portions. In some embodiments, one or more virtual device databases may be created to model the device resources corresponding to one or more portions of the programmable logic device to which the divided user design portions correspond to within the programmable logic device.

In some embodiments, the user design may be large and implemented across multiple programmable devices via an emulator device. The large user design may be divided to separate logic that can be placed and routed in the programmable device core fabric and logic that may be mapped into the programmable device periphery outside of the programmable device core fabric. In some embodiments, programmable fabric core logic may be included in the portion of the design corresponding to device periphery, to enable timing closure benefits during compilation. The separation of the programmable device design corresponding to the full programmable device may be separated by either designer or tool into the periphery logic (e.g., shell logic) and the programmable fabric core logic. The programmable fabric core logic may be further divided into multiple block-level designs based on design partitions within the programmable logic device. In some embodiments, the design may be divided proportionally based on the partitions defined on the device using a partition tool. In some embodiments, the compiler partitioning technique of the full programmable logic device (e.g., partial reconfiguration (PR), block-level compile) may be implemented. The full device database may be used to compile the block-level design. In other embodiments, a block-level design database for each partition may be implemented.

With the foregoing in mind, FIG. 1 illustrates a block diagram of a system 10 that may implement arithmetic operations. A designer may desire to implement functionality, such as the operations of this disclosure, on an integrated circuit device 12 (e.g., a programmable logic device, such as a field programmable gate array (FPGA) or an application specific integrated circuit (ASIC)). In some cases, the designer may specify a high-level program to be implemented, such as an OPENCL® program, which may enable the designer to more efficiently and easily provide programming instructions to configure a set of programmable logic cells for the integrated circuit device 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designer may implement high-level designs using design software 14, such as a version of INTEL® QUARTUS® by INTEL CORPORATION. The design software 14 may use a compiler 16 to convert the high-level program into a lower-level description. In some embodiments, the compiler 16 and the design software 14 may be packaged into a single software application. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit device 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
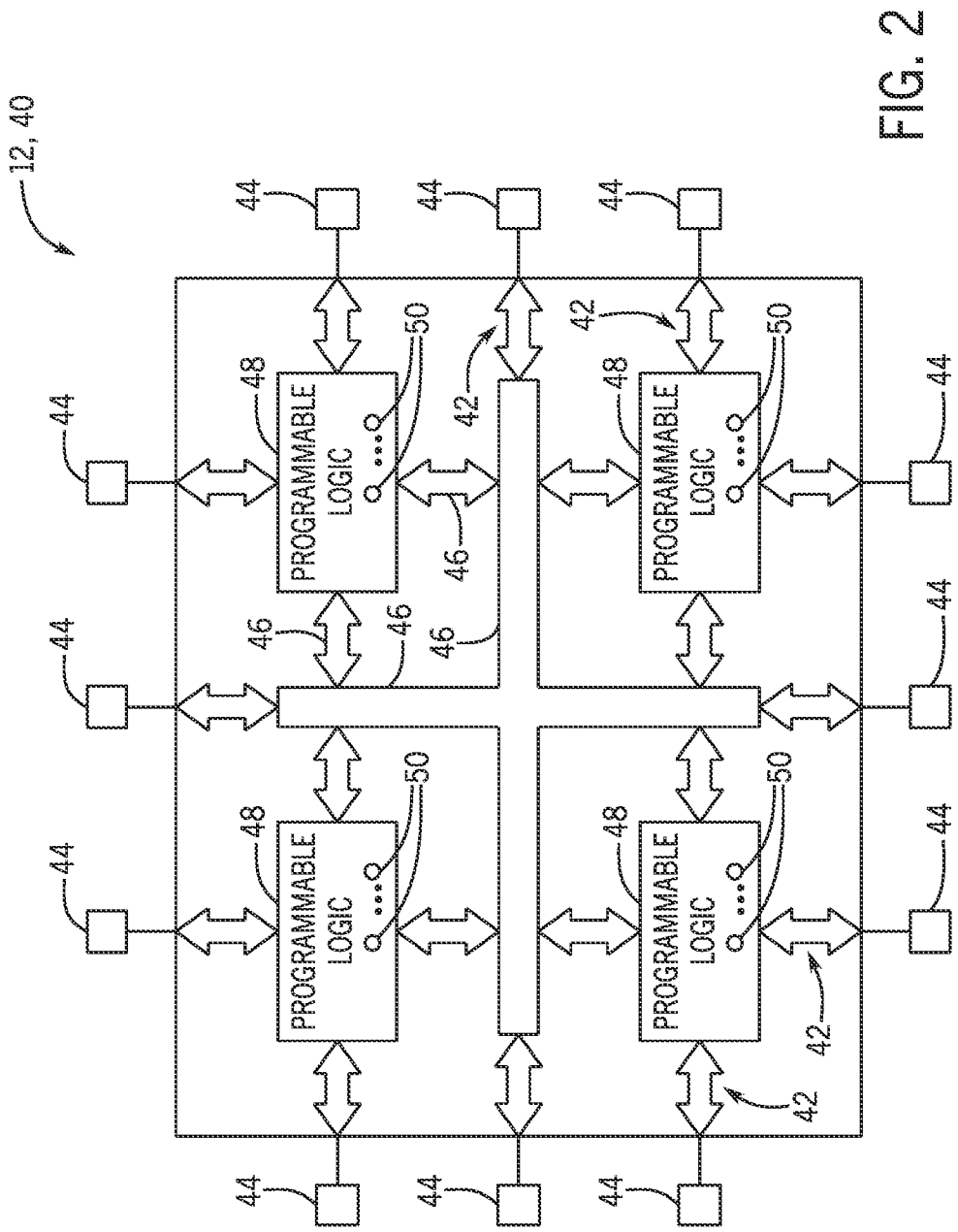
FIG. 2 is a block diagram of the integrated circuit device of FIG. 1, in accordance with an embodiment of the present disclosure.

Turning now to a more detailed discussion of the integrated circuit device 12, FIG. 2 is a block diagram of an example of the integrated circuit device 12 as a programmable logic device, such as a field-programmable gate array (FPGA). Further, it should be understood that the integrated circuit device 12 may be any other suitable type of programmable logic device (e.g., an ASIC and/or application-specific standard product). The integrated circuit device 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit device 12, may include programmable elements 50 with the programmable logic 48. In some embodiments, at least some of the programmable elements 50 may be grouped (e.g., into logic array blocks (LABs), configurable logic blocks (CLBs)). As discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology as described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
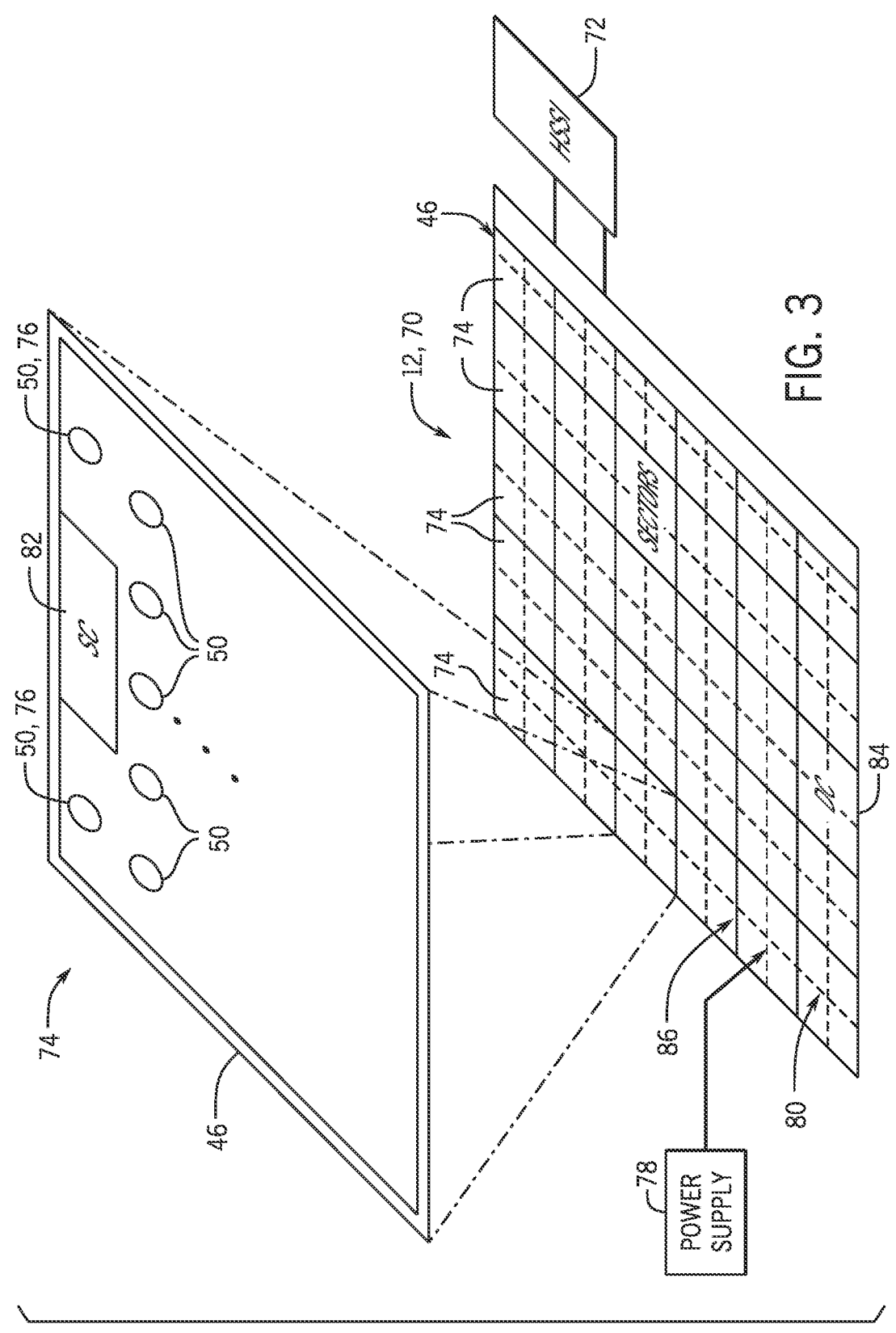
FIG. 3 is a diagram of programmable fabric of the integrated circuit device of FIG. 1, in accordance with an embodiment of the present disclosure.

The integrated circuit device 12 may include any programmable logic device such as a field programmable gate array (FPGA) 70, as shown in FIG. 3. For the purposes of this example, the FPGA 70 is referred to as an FPGA, though it should be understood that the device may be any suitable type of programmable logic device (e.g., an application-specific integrated circuit and/r application-specific standard product).

In the example of FIG. 3, the FPGA 70 may include a transceiver 72 that may include and/or use input/output circuitry, such as input/output circuitry 42 in FIG. 2, for driving signals off the FPGA 70 and for receiving signals from other devices. Interconnection resources 46 may be used to route signals, such as clock or data signals, through the FPGA 70. The FPGA 70 is sectorized, meaning that programmable logic resources may be distributed through a number of discrete programmable logic sectors 74. Programmable logic sectors 74 may include a number of programmable logic elements 50 having operations defined by configuration memory 76 (e.g., CRAM).

A power supply 78 may provide a source of voltage (e.g., supply voltage) and current to a power distribution network (PDN) 80 that distributes electrical power to the various components of the FPGA 70. Operating the circuitry of the FPGA 70 causes power to be drawn from the power distribution network 80.

There may be any suitable number of programmable logic sectors 74 on the FPGA 70. Indeed, while 29 programmable logic sectors 74 are shown here, it should be appreciated that more or fewer may appear in an actual implementation (e.g., in some cases, on the order of 50, 100, 500, 1000, 5000, 10,000, 50,000 or 100,000 sectors or more). Programmable logic sectors 74 may include a sector controller (SC) 82 that controls operation of the programmable logic sector 74. Sector controllers 82 may be in communication with a device controller (DC) 84.

Sector controllers 82 may accept commands and data from the device controller 84 and may read data from and write data into its configuration memory 76 based on control signals from the device controller 84. In addition to these operations, the sector controller 82 may be augmented with numerous additional capabilities. For example, such capabilities may include locally sequencing reads and writes to implement error detection and correction on the configuration memory 76 and sequencing test control signals to effect various test modes.

The sector controllers 82 and the device controller 84 may be implemented as state machines and/or processors. For example, operations of the sector controllers 82 or the device controller 84 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow routines to have multiple variants depending on "modes" the local controller may be placed into. When the control program memory is implemented as RAM, the RAM may be written with new routines to implement new operations and functionality into the programmable logic sectors 74. This may provide usable extensibility in an efficient and easily understood way. This may be useful because new commands could bring about large amounts of local activity within the sector at the expense of only a small amount of communication between the device controller 84 and the sector controllers 82.

Sector controllers 82 thus may communicate with the device controller 84, which may coordinate the operations of the sector controllers 82 and convey commands initiated from outside the FPGA 70. To support this communication, the interconnection resources 46 may act as a network between the device controller 84 and sector controllers 82. The interconnection resources 46 may support a wide variety of signals between the device controller 84 and sector controllers 82. In one example, these signals may be transmitted as communication packets.

The use of configuration memory 76 based on RAM technology as described herein is intended to be only one example. Moreover, configuration memory 76 may be distributed (e.g., as RAM cells) throughout the various programmable logic sectors 74 of the FPGA 70. The configuration memory 76 may provide a corresponding static control output signal that controls the state of an associated programmable logic element 50 or programmable component of the interconnection resources 46. The output signals of the configuration memory 76 may be applied to the gates of metal-oxide-semiconductor (MOS) transistors that control the states of the programmable logic elements 50 or programmable components of the interconnection resources 46.

As discussed above, some embodiments of the programmable logic device may include compilation flows that divide large user designs that may span multiple programmable logic devices into multiple smaller design partitions that may be compiled in parallel on different compute nodes of the programmable logic devices. The compilation methods may use either traditional timing closure at the full programmable device level, or may implement delay budgeting at partition boundaries of the divided design during design compilation.

Figure 4:
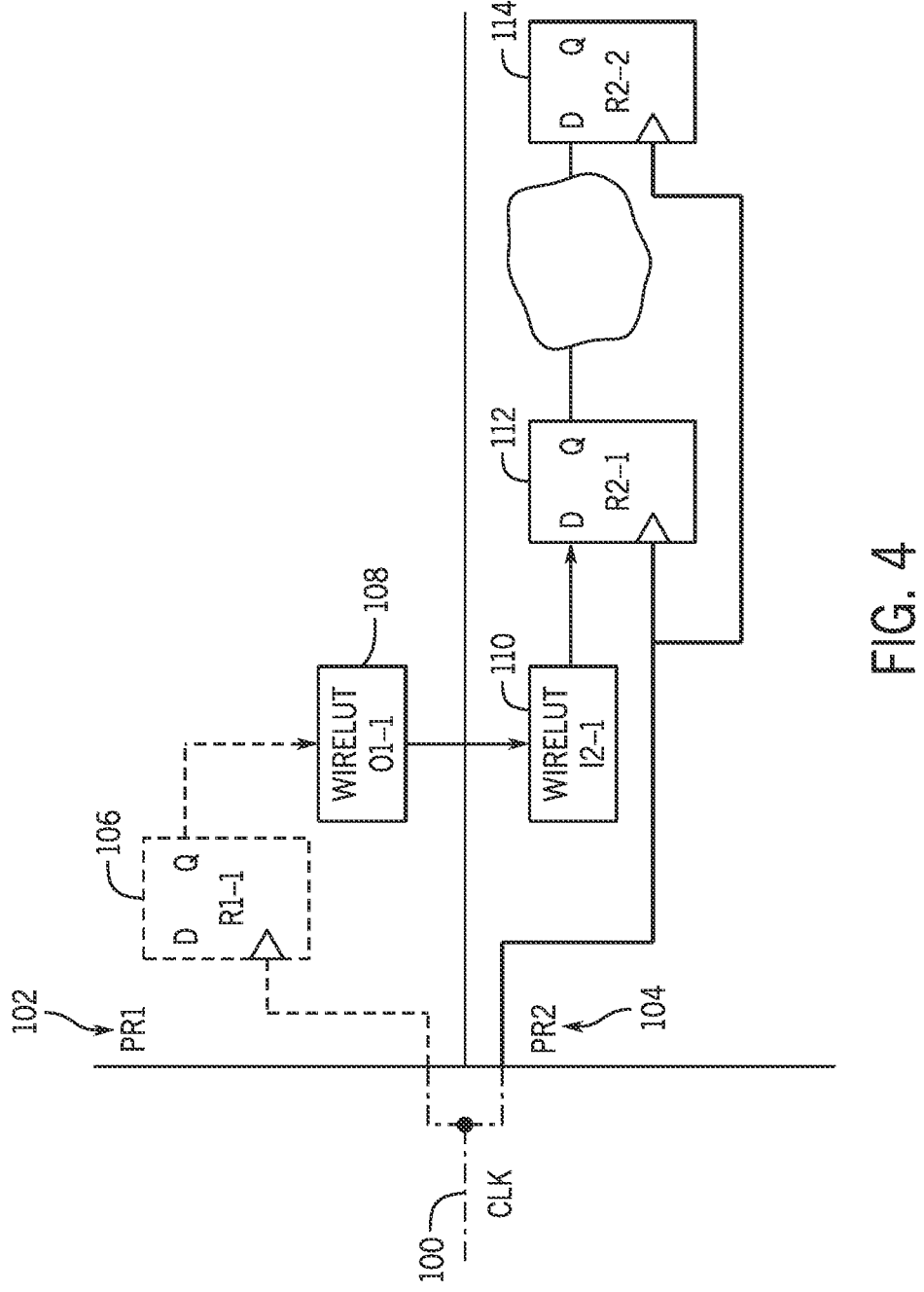
FIG. 4 is a block diagram of timing analysis for the programmable logic device, in accordance with an embodiment of the present disclosure.

With the foregoing in mind, FIG. 4 is a block diagram of timing analysis for the programmable logic device, in accordance with an embodiment of the present disclosure. During compilation of the design for the programmable logic device, timing analysis of one or more registers connected to the partition input outputs (IOs) may be completed to enable more efficient design compilations. The compiling for a block-level partition may include multiple registers and register-to-register transfers of design data.

For example, the received clock signal 100 at the partition boundary of the design may include a first partition route (PR1) 102 and a second partition route (PR2) 104 that includes the register-to-register transfer from a second register (R2-1) 112 to a third register (R2-2) 114. In some embodiments, the register-to-register transfer from the first register 106 to the third register 114 may take place via one or more wirelut circuitry at partition input and output anchor points 108, 110. During compilation the block-level design the second partition route 104 may be compiled independently from first partition route 102. The location of a first register (R1-1) 106 may be unknown during compilation, and the routing path delay from the first register 106 to the partition output anchor point (O1-1) 108 may also be unknown.

In some embodiments, full programmable logic device level compilation and timing closure may be implemented. Timing constraints may be defined to ensure compilation at partition IOs is efficient. The data delay budget from the partition input and output anchors 108, 110 to the register inputs and outputs may be defined. The budget from the register outputs to the partition output anchor applies to the path from the partition input anchor point (I2-1) 110 to the second register 112 input. The delay between the partition input anchor and output anchor 108, 110, (e.g., such as the path O1-1 to I2-1 may be known for budgeting purposes. Additionally, the clock input skew from the common clock tree node of the programmable logic device among all the partitions to the registers 106, 112, 114 connected to the partition input and output anchor points 108, 110 may be defined. The clock skew amount may be calculated based on the worst-case structure skew of the entire clock tree. The calculated clock skew along with other sources of uncertainty, such as process variation, is defined as clock uncertainly in the design timing constraints.

The device image outputs that define the programmable device configuration may be combined because there is not overlapping resource conflict among all the design partitions for the device output (e.g., SOF (binary file), bitfile). The image combination method may be fast (e.g., 1 minute) compared to traditional compilation methods (e.g., 30 hours, 20 hours) as it is primarily a bit-wise operation. The final device image is combined from the shell design and the block-level design images. The final device image may then be implemented to configure the programmable device.

In some embodiments, in which delay budgeting is implemented at partition boundaries of the programmable device design, the data delay budget from the partition input anchor point 110 to the partition output anchor point 108 and the data delay budget from the register outputs to the partition output anchor point 108 are defined. The delay between the partition input and output anchor points 108, 110 is known for the data delay budget purposes, similar to the traditional timing closure embodiment discussed above. It should be understood that any suitable timing constraint method may be applied to the design compilation.

Figure 5:
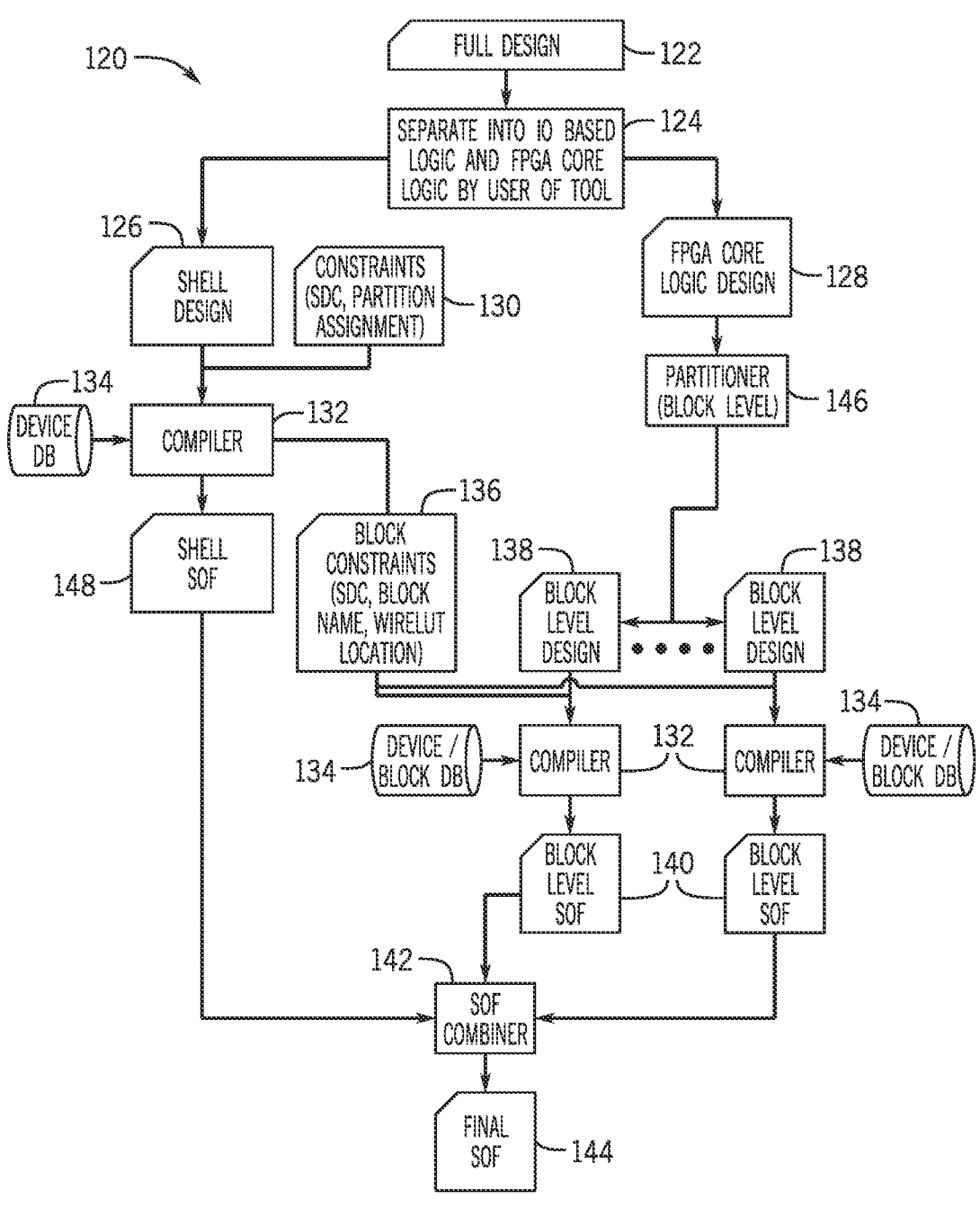
FIG. 5 is a block diagram of a first compilation flow for the programmable logic device using timing closure at the device level, in accordance with an embodiment of the current disclosure.

With the foregoing in mind, FIG. 5 is a block diagram of a first compilation flow 120 for the programmable logic device using timing closure at the device level, in accordance with an embodiment of the current disclosure. As discussed above, the first compilation flow 120 may divide the full design 122 into one or more smaller designs and implement compiler partitioning of the full programmable device, and may implement traditional timing closure at the device level.

The first compilation flow 120 may receive the full design 122 that needs to be compiled for the programmable logic device. The full design 122 may correspond to the design for one or more programmable logic devices, such as implemented when using an emulator device. The first compilation flow 120 may then separate the full design, at block 124, into the IO based logic (e.g., shell logic) and programmable device core logic. This separation may be completed by either the designer and/or by a tool component. The initial full design 122 may be divided to separate the logic of the programmable core logic design 128 and the periphery (e.g., shell) design 126 that may be placed and routed in the programmable device core fabric, and the logic that may be mapped into the device periphery at the outside of the core fabric. To enable timing closure benefit, some portions of programmable core logic design 128 may be included in the design portion associated with the device periphery. The shell logic 126 may be as small as possible and include only the logic mapped into the IO cell within the design.

In some embodiments, the full design 122 may be divided into one or smaller design partitions without consideration to the device periphery and core fabric. The compiler partitioning technique of the full programmable logic device may be partial reconfiguration (PR), block-level compile, or any suitable compiling technique. This may provide flexibility in defining of the device partitions. Additionally, the partitioning decisions may be decided by one or more users of the programmable logic device. It should be understood that any suitable partitioning methods may be implemented during the compilation flows. The compilation may be completed using one or more compute nodes, one or more cloud computing systems, or any other type of distributed computer network. This may enable compilation software to be run across multiple networks, computer nodes, or server and/or storage devices. This may increase speed of compilation and also enable resource conservation relative to running compilations on a single computing device.

The full design 122, as discussed above, may be split into a shell design 126 that corresponds to periphery logic and a programmable core logic design 128. The shell design 126 may be compiled using the compiler 16. The compiler may compile the shell design 126 based on constraint data 130 corresponding to SDC (INTEL® scalable dataframe compiler), partition assignment, and other suitable constraint criteria. The compiler 16 may use the device database 134 (e.g., full device database) to compile the shell design 126. In some embodiments, the compiler 16 may utilize one or more virtual device databases they may be created to model the programmable logic device resources and associated portions of the programmable logic device to which the divided design portions are compiled. The virtual device database may only contain the programmable fabric core logic 128 based on if the initial full design 122 is separated based on the logic that may be placed and routed in the programmable device core fabric, and the logic that may be mapped into the device periphery at the outside of the core fabric. The virtual device database may include the device periphery resources together with the programmable fabric when the large user design is divided without consideration of device periphery and the core fabric. The shell design SOF 148 (e.g., binary file generated by the compiler) may be output from the compiler 16 and sent to the SOF (e.g., binary file) combiner circuitry 142.

With regard to the partitioning of the programmable core logic design 128, the division may be completed by a partitioner program 146 (e.g., tool or manually by the designer). The partitioning may include logical hierarchy-based partitioning and/or physical placement-based partitioning, optimizing for various metrics, such as wire crossings between partitions, wire length of crossings, timing violations across partitions, and other suitable partitioning methods. The criteria are to fit such block-level designs 136 into its respective partition within the programmable logic device. Each partition is defined with a collection of programmable core fabric partitions and a collection of input and output anchor points 108, 110, which are used to model the top-level input and output ports of the block-level design. The block-level designs 138 may be based on the partitions defined within the programmable logic device. In some, embodiments the design may be divided proportionally based on the partitions defined on the programmable logic device.

The programmable core logic design 128 may be partitioned at the block level, with the output block-level design being sent to one or more compilers 132 that also receive device and block data from the device database 134. In some embodiments, the compiler 16 may also receive block constraints 136 resulting from the compilation of the shell design 126. In this case, there may be device resources during partitioning reserved for the block-level designs 138, such that resources utilized by the shell design compilation may be defined as resource exclusion constraints to the block-level design compilation.

The output of the compilation of the block level design 138, resulting in the block level SOF 140 is sent to the SOF combiner circuitry 142. The SOF combiner circuitry 142 is able to combine the shell SOF 148 along with the block level SOF 140 into the output final SOF 144 that may be the resulting design within the programmable logic device. The image combination method may be very fast (e.g., less than one hour) as it is primarily a bitwise operations. The final device image output is the resulting combination of the shell design 126 and the block-level designs 138. The final device image output may then be used to configure the programmable logic device according to the initial full design 122 received by the programmable logic device.

Figure 6:
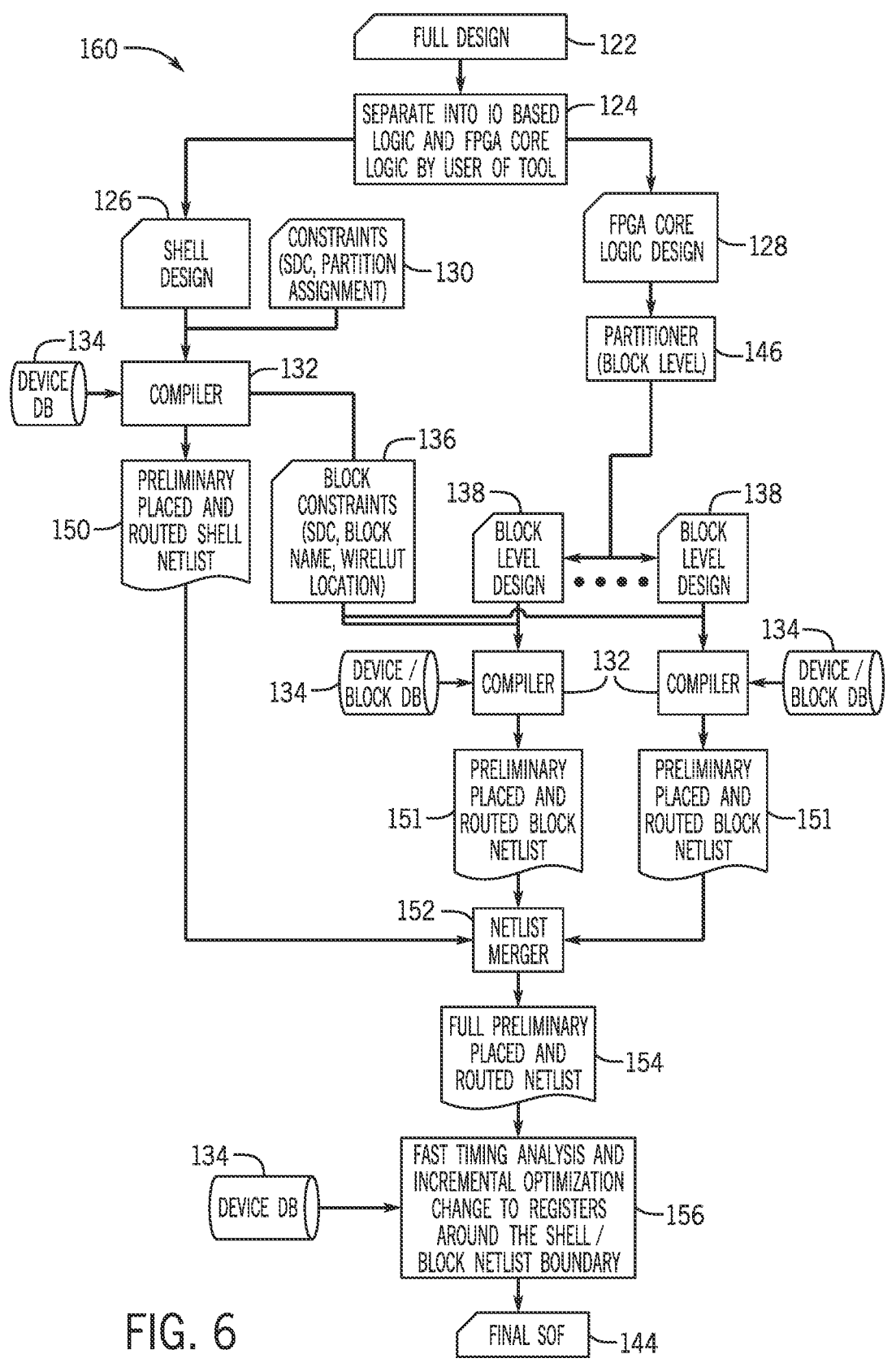
FIG. 6 is a block diagram of a second compilation flow for the programmable logic device using delay budgeting at one or more partition boundaries, in accordance with an embodiment of the current disclosure.
Figure 7:
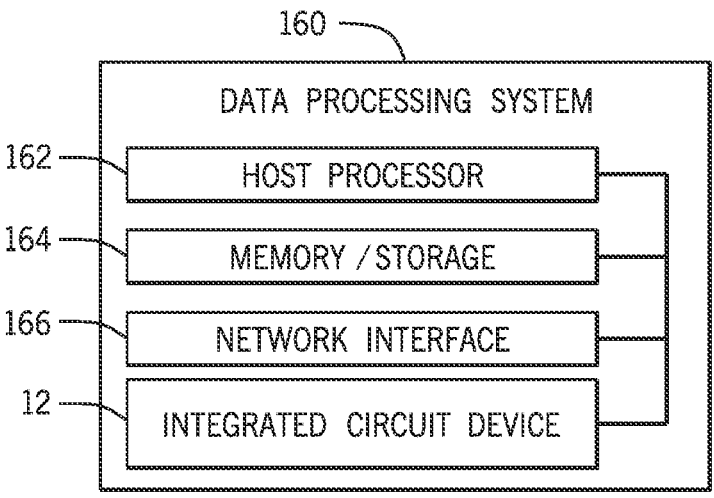
FIG. 7 is a block diagram of a data processing system, in accordance with an embodiment of the present disclosure.

In some embodiments, the compilation methods may implement or may implement delay budgeting at partition boundaries of the compilation design. For example, FIG. 6 is a block diagram of a second compilation flow 160 for the programmable fabric using timing closure at the partition boundary level, in accordance with an embodiment of the current disclosure.

As discussed above, the second compilation flow 160 may divide the full design 122 into multiple smaller designs, and utilize timing closure at the partition boundaries of the smaller designs. The full design 122 may correspond to the design for one or more programmable logic devices, such as implemented when using the programmable logic device as an emulator device. The full design may be separated, at block 124, into the IO based logic and programmable device core logic block. This separation may be completed by either the designer and/or by or a tool component. The initial full design 122 may be divided to separate the logic of the programmable core logic design 128 and the periphery (e.g., shell) design 126 that may be placed and routed in the programmable device core fabric, and the logic that may be mapped into the device periphery at the outside of the core fabric. To enable timing closure benefit, some portions of programmable core logic design 128 may be included into the design portion associated with the device periphery. The compilation may be completed using one or more compute nodes, one or more cloud computing systems, or any other type of distributed computer network. This may enable compilation software to be run across multiple networks, computer nodes, or server and/or storage devices. This may increase speed of compilation and also enable resource conservation relative to running compilations on a single computing device.

The full design 122, as discussed above, may be split into a shell design 126 that corresponds to periphery logic and a programmable core logic design 128. The shell design 126 may be compiled using the compiler 16. The compiler may compile the shell design 126 based on constraint data 130 in any suitable form (e.g., corresponding to SDC (Synopsys Design Constraints)), partition assignment, and other suitable constraint criteria. The compiler 16 may use the device database 134 (e.g., full device database) to compile the shell design 126. In some embodiments, the compiler 16 may utilize one or more virtual device databases that may be created to model the programmable logic device resources and associated portions of the programmable logic device to which the divided design portions are compiled.

The virtual device database may contain the programmable core logic design 128 if the initial full design 122 is separated based on the logic that may be placed and routed in the programmable device core fabric, and the logic that may be mapped into the device periphery at the outside of the core fabric. The virtual device database may include the device periphery resources together with the programmable fabric when the large user design is divided without consideration of device periphery and the core fabric. It should be understood that any suitable compilation method may be implemented.

The output of the compilation of the shell design 126 is preliminary placed and routed to a shell netlist 150 that is then sent to the netlist merger circuitry 152.

With regard to the partitioning of the programmable core logic design 128, the division may be completed by partitioner program 146 (e.g., tool or manually by the designer). The compiler may use a block-level device database 134 for each of the design partitions. The block-level device database 134 for each partition may be proportional to the full device database size based on the partition area size. The block-level device database 134 is used to compile the block-level design 138. The output of the compilation of the block level design 138 is preliminary placed and routed to a block netlist 151 that is then sent to the netlist merger 152. The netlist merger 152 may produce a full preliminary placed and routed netlist 154 that may combine the shell and block level compilation output. Fast timing analysis and incremental optimization change to registers around the shell and block level netlist boundaries 156, using the device database input, may be applied to the full preliminary placed and routed netlist 154. The output of the fast timing analysis 156 is a final SOF 144 design. The final device image output is assembled directly from the full netlist after the optimization operations in regard to fast timing analysis 156. The final device image output may then be used to configure the programmable logic device according to the initial full design 122 received by the programmable logic device. The output of the compilation process may be similar to the processes described in FIG. 1 with regards to programming the programmable device.

Keeping the foregoing in mind, the integrated circuit device 12 may be a data processing system or a component included in a data processing system. For example, the integrated circuit device 12 may be a component of a data processing system 160 shown in FIG. 8. The data processing system 160 may include a host processor 162 (e.g., a central-processing unit (CPU)), memory and/or storage circuitry 164, and a network interface 286. The data processing system 160 may include more or fewer components (e.g., electronic display, user interface structures, application specific integrated circuits (ASICs)). The host processor 162 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 160 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 164 may include random access memory (RAM), read-only memory (ROM), one or more hard drives, flash memory, or the like. The memory and/or storage circuitry 164 may hold data to be processed by the data processing system 160. In some cases, the memory and/or storage circuitry 164 may also store configuration programs (bitstreams) for programming the integrated circuit device 12. The network interface 166 may allow the data processing system 160 to communicate with other electronic devices. The data processing system 160 may include several different packages or may be contained within a single package on a single package substrate.

In one example, the data processing system 160 may be part of a data center that processes a variety of different requests. For instance, the data processing system 160 may receive a data processing request via the network interface 166 to perform acceleration, debugging, error detection, data analysis, encryption, decryption, machine learning, video processing, voice recognition, image recognition, data compression, database search ranking, bioinformatics, network security pattern identification, spatial navigation, digital signal processing, or some other specialized tasks.

EXAMPLE EMBODIMENTS

EXAMPLE EMBODIMENT 1. A system comprising:
memory storing instructions; and a processor that, when executing the instructions, performs operations comprising: receiving a full design comprising a user design for a programmable fabric of a programmable logic device; dividing the full design into a plurality of design partitions; cause the compilation of the plurality of design partitions in parallel at one or more compute nodes of the system; and combining the compiled plurality of design partitions into an output final device image.

EXAMPLE EMBODIMENT 2. The system of example embodiment 1 wherein dividing the full design into the plurality of design partitions comprises: dividing the full design into programmable core fabric logic and periphery logic.

EXAMPLE EMBODIMENT 3. The system of example embodiment 2 wherein the periphery logic comprises logic that can be mapped into the periphery of the programmable logic device outside of the programmable core fabric logic.

EXAMPLE EMBODIMENT 4. The system of example embodiment 2, wherein the programmable core fabric logic is further divided into one or more block-level designs based on the plurality of programmable logic device partitions.

EXAMPLE EMBODIMENT 5. The system of example embodiment 1, wherein dividing the full design into the plurality of design partitions comprises:
dividing the full design proportionally based on one or more partitions defined on the programmable logic device.

EXAMPLE EMBODIMENT 6. The system of example embodiment 1, wherein a full programmable device database is used to compile the plurality of design partitions.

EXAMPLE EMBODIMENT 7. The system of example embodiment 1, wherein the system comprises one or more computing devices within a network, a cloud computing system, one or more distributed databases, or any combination thereof.

EXAMPLE EMBODIMENT 8. The system of example embodiment 1, wherein one or more virtual device databases are used to compile the plurality of design partitions, wherein the one or more virtual device databases model one or more device resources associated with partitions of the programmable logic device.

EXAMPLE EMBODIMENT 9. The system of example embodiment 1, wherein dividing the full design in to the plurality of design partitions is based on logical hierarchy within the programmable logic device, physical placement within the programmable logic device, wire length of crossing within the programmable logic device, partition timing within the programmable logic device, number of wires crossing partitions, or any combination thereof.

EXAMPLE EMBODIMENT 10. A method comprising:
receiving a full design comprising a user design for a programmable fabric of a programmable logic device;
dividing, via one or more processors, the full design into a plurality of design partitions, wherein the plurality of design partitions correspond to core fabric logic and periphery logic; and
compiling, via the one or more processors, the plurality of design partitions in parallel at one or more compute nodes of a computing system.

EXAMPLE EMBODIMENT 11. The method of example embodiment 10, wherein one or more design partitions of the plurality of design partitions corresponding to the periphery logic comprise core fabric logic.

EXAMPLE EMBODIMENT 12. The method of example embodiment 10, wherein a user, a design tool, or both divides the full design into the plurality of design partitions based on the periphery logic and the core fabric logic.

EXAMPLE EMBODIMENT 13. The method of example embodiment 10, wherein the method comprises:
merging, via the one or more processors, one or more netlists associated with place and route of the periphery logic and one or more netlists associated with place and route of the core fabric logic into a final netlist.

EXAMPLE EMBODIMENT 14. The method of example embodiment 13, wherein a output final device image is generated from the final netlist.

EXAMPLE EMBODIMENT 15. The method of example embodiment 10, wherein a output final image comprises combining the one or more design partitions of the plurality of design partitions that correspond to the periphery logic with the one or more design partitions of the plurality of design partition that correspond to the core fabric logic.

EXAMPLE EMBODIMENT 16. The method of example embodiment 10, wherein determining timing constrains at the plurality of design partitions, wherein determining the timing constraints comprise determining a data delay budget from a partition input anchor to one or more register outputs.

EXAMPLE EMBODIMENT 17. A system comprising:
memory storing instructions; and a processor that, when executing the instructions, performs operations comprising:
receiving a full design comprising a user design for a programmable fabric of a programmable logic device;
dividing the full design into a plurality of design partitions wherein the programmable core fabric logic is further divided into one or more block-level designs based on the plurality of programmable logic device partitions;

cause the compilation of the plurality of design partitions in parallel at one or more compute nodes of the system; and combining the compiled plurality of design partitions into an output final device image.

EXAMPLE EMBODIMENT 18. The system of example embodiment 17, wherein the system comprises one or more computing devices within a network, a cloud computing system, one or more distributed databases, or any combination thereof.

EXAMPLE EMBODIMENT 19. The system of example embodiment 17, wherein one or more virtual device databases are used to compile the plurality of design partitions, wherein the one or more virtual device databases model one or more device resources associated with partitions of the programmable logic device.

EXAMPLE EMBODIMENT 20. The method of example embodiment 17, wherein a full programmable device database is used to compile the plurality of design partitions.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A system comprising:

memory storing instructions; and a processor that, when executing the instructions, performs operations comprising:

receiving a full design comprising a user design for a programmable fabric of a programmable logic device;

dividing the full design proportionally into a plurality of design partitions based on one or more partitions defined on the programmable logic device;

cause a compilation of the plurality of design partitions in parallel at a plurality of compute nodes of the system; and combining the compiled plurality of design partitions into an output final device image.

2. The system of claim 1, wherein dividing the full design into the plurality of design partitions comprises:

dividing the full design into programmable core fabric logic and periphery logic.

3. The system of claim 2, wherein the periphery logic comprises logic that can be mapped into a periphery of the programmable logic device outside of the programmable core fabric logic.

4. The system of claim 2, wherein the programmable core fabric logic is further divided into one or more block-level designs based on the plurality of design partitions.

5. The system of claim 1, wherein a full programmable device database is used to compile the plurality of design partitions.

6. The system of claim 1, wherein the system comprises a plurality of computing devices within a network, a cloud computing system, a distributed computing system, or any combination thereof.

7. The system of claim 1, wherein a plurality of virtual device databases are used to compile the plurality of design partitions, wherein the plurality of virtual device databases model one or more device resources associated with partitions of the programmable logic device.

8. The system of claim 1, wherein dividing the full design into the plurality of design partitions is based on logical hierarchy within the programmable logic device, physical placement within the programmable logic device, wire length of crossing within the programmable logic device, partition timing within the programmable logic device, number of wires crossing partitions, or any combination thereof.

9. A method comprising:

receiving a full design comprising a user design for a programmable fabric of a programmable logic device;

dividing, via one or more processors, the full design proportionally into a plurality of design partitions based on one or more partitions defined on the programmable logic device, wherein the plurality of design partitions correspond to core fabric logic and periphery logic; and compiling, via the one or more processors, the plurality of design partitions in parallel at a plurality of compute nodes of a computer system.

10. The method of claim 9, wherein one or more design partitions of the plurality of design partitions corresponding to the periphery logic comprise the core fabric logic.

11. The method of claim 9, wherein a user, a design tool, or both divide the full design into the plurality of design partitions based on the periphery logic and the core fabric logic.

12. The method of claim 9, wherein the method comprises:

merging, via the one or more processors, one or more netlists associated with place and route of the periphery logic and the one or more netlists associated with place and route of the core fabric logic into a final netlist.

13. The method of claim 12, wherein an output final device image is generated from the final netlist and boundary optimization processes comprising timing analysis at one or more core fabric logic boundaries and periphery logic boundaries of the plurality of design partitions.

14. The method of claim 9, wherein the method comprises combining one or more design partitions of the plurality of design partitions that correspond to the periphery logic with the one or more design partitions of the plurality of design partitions that correspond to the core fabric logic to generate a output final device image.

15. The method of claim 9, wherein determining timing constrains at the plurality of design partitions comprises determining a data delay budget from a partition input anchor to one or more register outputs.

16. A system comprising:

memory storing instructions; and a processor that, when executing the instructions, performs operations comprising:

receiving a full design comprising a user design for a programmable fabric of a programmable logic device;

dividing the full design proportionally into a plurality of design partitions based on one or more partitions defined on the programmable logic device, and wherein the plurality of design partitions are further divided into one or more block-level designs based on partitions of the programmable logic device;

cause a compilation of the plurality of design partitions in parallel at a plurality of compute nodes of the system to generate a periphery logic image and one or more block-level images; and combining the periphery logic image and the one or more block-level images into an output final device image.

17. The system of claim 16, wherein the system comprises a plurality of computing devices within a network, a cloud computing system, a distributed computing system, or any combination thereof.

18. The system of claim 16, wherein a plurality of virtual device databases are used to compile the plurality of design partitions, wherein the plurality of virtual device databases model one or more device resources associated with partitions of the programmable logic device.

19. The system of claim 16, wherein a full programmable device database is used to compile the plurality of design partitions.

\* \* \* \* \*